United States Patent
Bracco

(10) Patent No.: US 9,537,454 B2
(45) Date of Patent: Jan. 3, 2017

(54) ELECTRONIC DEVICE FOR GENERATION OF AN AUDIBLE ALARM OR MUSIC

(71) Applicant: The Swatch Group Research and Development Ltd, Marin (CH)

(72) Inventor: Massimiliano Bracco, Le Landeron (CH)

(73) Assignee: The Swatch Group Research and Development Ltd, Marin (CH)

( * ) Notice: Subject to any disclaimer, the term of this patent is extended or adjusted under 35 U.S.C. 154(b) by 0 days.

(21) Appl. No.: 14/863,892

(22) Filed: Sep. 24, 2015

(65) Prior Publication Data

US 2016/0100251 A1   Apr. 7, 2016

(30) Foreign Application Priority Data

Oct. 6, 2014 (EP) .................................. 14187778

(51) Int. Cl.
| | |
|---|---|
| *H04R 29/00* | (2006.01) |
| *H03F 3/183* | (2006.01) |
| *G10K 9/12* | (2006.01) |
| *B06B 1/02* | (2006.01) |
| *H03F 3/217* | (2006.01) |
| *H04R 17/10* | (2006.01) |

(52) U.S. Cl.
CPC ............. *H03F 3/183* (2013.01); *B06B 1/0207* (2013.01); *G10K 9/12* (2013.01); *H03F 3/217* (2013.01); *B06B 2201/51* (2013.01); *B06B 2201/55* (2013.01); *H03F 2200/03* (2013.01); *H04R 17/10* (2013.01); *H04R 2499/11* (2013.01)

(58) Field of Classification Search
CPC ............... H04R 2499/11; H04R 1/2807; H03F 2200/03; H03F 3/217; G10K 9/00; H10K 9/12

USPC ...................... 381/111, 116, 58–59, 123, 120
See application file for complete search history.

(56) References Cited

U.S. PATENT DOCUMENTS

| | | | |
|---|---|---|---|
| 4,972,438 A | 11/1990 | Silvian | |
| 5,057,785 A * | 10/1991 | Chung | G11B 5/012 327/311 |
| 2005/0162223 A1 | 7/2005 | Maejima | |
| 2012/0119797 A1 | 5/2012 | Oshima | |

(Continued)

FOREIGN PATENT DOCUMENTS

| | | |
|---|---|---|
| GB | 2452790 A | 3/2009 |
| WO | 2005/114833 A2 | 12/2005 |

OTHER PUBLICATIONS

European Search Report of EP 14187778 dated Apr. 8, 2015.

*Primary Examiner* — Disler Paul
(74) *Attorney, Agent, or Firm* — Sughrue Mion, PLLC

(57) ABSTRACT

The electronic device is arranged for generation of an audible alarm or music. It includes a coil or inductor and a buzzer provided with a capacitor connected in series with the coil. When the electronic device is actuated, the buzzer generates the audible alarm or music. The electronic device further includes, in a feedback loop, a derivative circuit connected to a connection node between the coil and the capacitor, to produce a derivative of the signal from the capacitor, and a comparator for comparing a derivative signal from the derivative circuit with a reference voltage. The comparator supplies an output signal to the coil to amplify the signal across the capacitor, so that the buzzer generates at least one audible alarm.

10 Claims, 3 Drawing Sheets

(56) References Cited

U.S. PATENT DOCUMENTS

2015/0381130 A1\* 12/2015 Das .................. H03M 1/70
　　　　　　　　　　　　　　　　　　381/107

\* cited by examiner

ELECTRONIC DEVICE FOR GENERATION OF AN AUDIBLE ALARM OR MUSIC

This application claims priority from European patent application No. 14187778.7 filed Oct. 6, 2014, the entire disclosure of which is hereby incorporated by reference.

FIELD OF THE INVENTION

The invention concerns an electronic device for generating an audible alarm or music. The device may be fitted to a portable electronic instrument, such as a watch. The device notably includes at least one coil connected to a buzzer of the capacitive type.

BACKGROUND OF THE INVENTION

In conventional electronic systems provided with at least one buzzer, in particular provided with a piezoelectric element, there is provided a coil linked to the buzzer, and both are connected to a control circuit. The control circuit may include a transistor arranged in series with the coil and the buzzer between two terminals of a supply voltage source. When the electronic system is put into operation to generate a sound, such as an alarm, pulses are applied to the gate or base of the transistor to excite the assembly formed by the coil and the buzzer.

Generally, it is sought to adjust the frequency of the control circuit as a function of the resonance frequency of the assembly formed by the coil and the buzzer. To achieve this, a first phase must be provided for measurement of the resonance frequency. Then, in a feedback loop, the response of the mechanical sound generation assembly can be sampled, to adjust the frequency of the control pulses. This frequency must be adjusted close to the resonance frequency of the mechanical sound generation assembly to generate a sound having sufficient sound level while limiting the electrical energy required. However, it is noted that it is difficult for the control circuit to work permanently at this adjusted frequency, since the mechanical assembly often experiences a natural change in its physical parameters over time. Replacement of the resonant system in an after-sales operation can also impair the efficiency of the original device. This constitutes a drawback of such a conventional electronic system.

SUMMARY OF THE INVENTION

It is therefore an object of the invention to provide an electronic device for generating an audible alarm or music overcoming the aforementioned drawbacks of the state of the art, in order to generate a high volume alarm or music at low supply voltage regardless of the evolution of the resonant system over time.

To this end, the invention concerns an electronic device for generation of an audible alarm or music, which includes at least one coil or inductor and a buzzer, which includes at least one capacitor connected in series with the coil, for generation of an audible alarm or music when the electronic device is actuated, wherein the electronic device includes in a feedback loop,
a derivative circuit connected to a connection node between the coil and the capacitor of the buzzer, to produce a derivative of the signal from the capacitor, and a comparator for comparing a derivative signal of the derivative circuit with a reference voltage, the comparator supplying an output signal to the coil to amplify the signal across the capacitor, in order to generate at least one audible alarm.

Specific embodiments of the electronic device for generation of an audible alarm or music are defined in the dependent claims 2 to 10.

One advantage of the electronic device for generation of an audible alarm lies in the fact that a positive feedback loop is provided in which the derivative of the voltage across the capacitive type alarm device or buzzer is measured. A resonant effect is obtained without having to calculate the resonance frequency of the assembly formed by the coil and the buzzer, independently of any variations in physical parameters or change in the buzzer.

BRIEF DESCRIPTION OF THE DRAWINGS

The objects, advantages and features of the electronic device for generation of an audible alarm or music will appear more clearly in the following description, based on at least one non-limiting embodiment illustrated by the drawings, in which.

DETAILED DESCRIPTION OF THE INVENTION

In the following description, all those electronic components of the electronic device that are well known to those skilled in the art in this technical field will be described only in a simplified manner.

Figure 1:
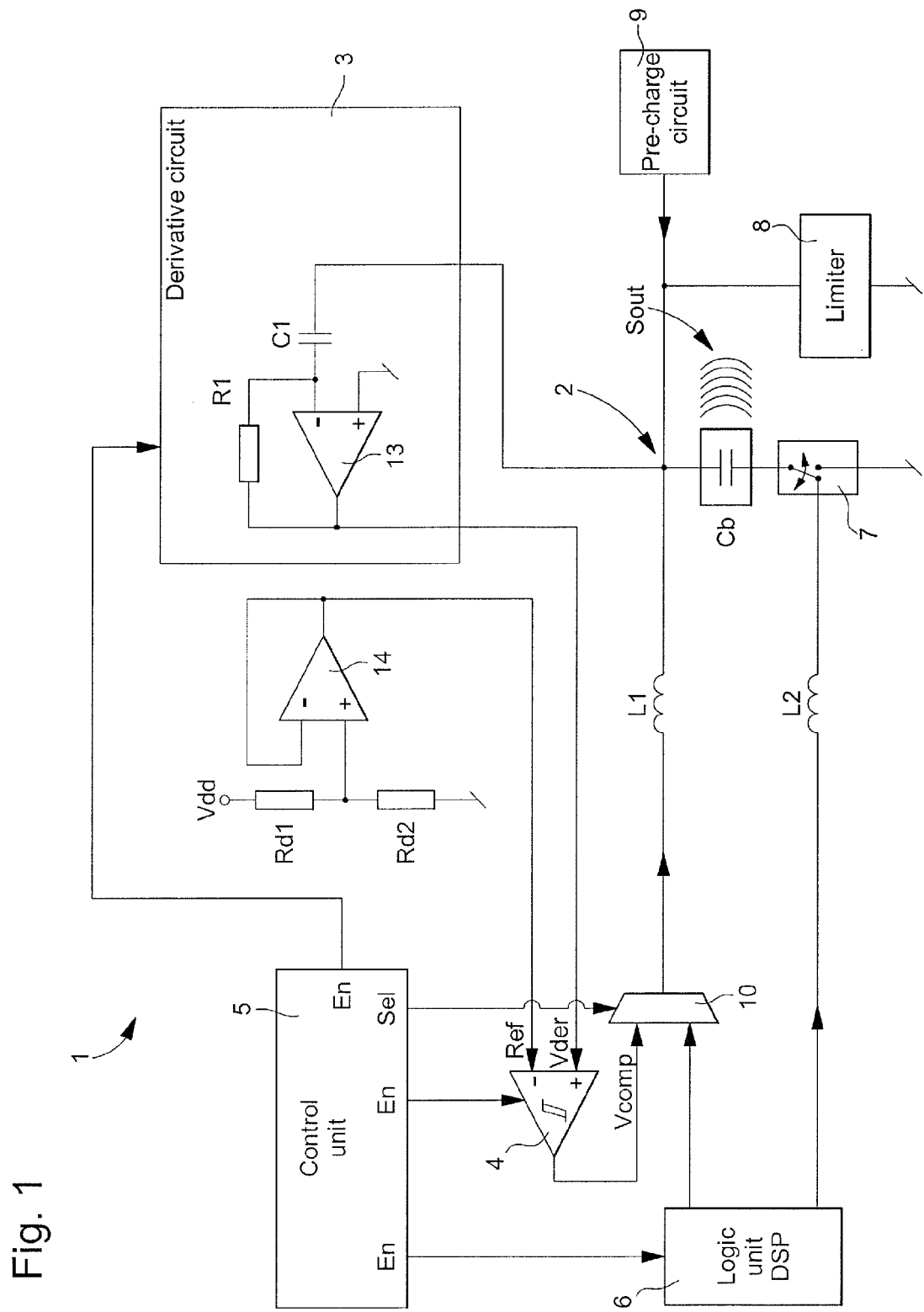
FIG. 1 shows a simplified view of the various components of the device for generation of an audible alarm or music according to the invention.

FIG. 1 shows an embodiment of the electronic device or electronic circuit 1. Electronic device 1 may be powered by a conventional supply voltage source, such as a battery. Electronic device 1 includes an assembly 2 formed of a first coil or inductor L1 connected to a capacitive type buzzer Cb for generation of a sound or music Sout. The first coil L1 is connected to a first electrode of buzzer Cb, while the second electrode of buzzer Cb can be connected by means of a switch 7 to a zero voltage or to an earth terminal.

It is to be noted that a buzzer Cb may be formed of an acoustic membrane on which is arranged a piezoelectric element. This piezoelectric element can be electrically actuated to vibrate the membrane, which therefore generates a sound or music. The piezoelectric element is generally formed between a first electrode and a second electrode in a first branch of a resistor, of an inductor, and of a first capacitor in series, and in a second parallel branch of a second capacitor. The second capacitor is of much larger size than the other components of the first branch and as a first approximation, it is possible to consider said piezoelectric element as a capacitor Cb. In these conditions, the specification refers to a capacitive type buzzer, since the generation of a sound or music by the membrane is obtained by actuating capacitor Cb.

In a feedback loop, electronic device 1 also includes a derivative circuit 3, which is connected to the connection node between first coil L1 and buzzer Cb. Derivative circuit 3 is provided to produce a derivative of the signal across the first electrode of buzzer Cb. Derivative signal Vder at the output of derivative circuit 3 is provided to a first input of a comparator 4, whose second input receives a reference voltage Ref for comparison with derivative signal Vder of derivative circuit 3. Preferably, the first input of comparator 4 is a positive input, whereas the second input of comparator 4 is a negative input. Further, reference voltage Ref may be set at half the supply voltage Vdd of the electronic device, namely at Vdd/2. The output signal Vcomp of comparator 4 is provided to a free end of first inductor L1 to activate the generation of a sound or music Sout by buzzer Cb.

It is to be noted that reference voltage Ref may be obtained by a resistive divider composed of a first resistor Rd1 and a second resistor Rd2, which are connected in series to a supply voltage source Vdd, which powers the various components of electronic device 1. Preferably, a follower amplifier 14 may also be provided with a positive input connected to the connection node of the two resistors Rd1 and Rd2, and a negative input connected to the output of follower amplifier 14 to supply reference voltage Ref. If the two resistors have the same resistive value, a reference voltage Ref equal to Vdd/2 will be provided, but the two resistors may also have different resistive values to modify reference voltage Ref depending on the desired mode of driving buzzer Cb.

According to the principle of the invention, the feedback loop with assembly 2 composed of first inductor L1 and buzzer Cb, is arranged to drive first coil L1 with positive voltages or positive voltage pulses, when capacitor Cb of the buzzer is in charge phase. Conversely, first coil L1 receives a zero voltage when capacitor Cb of the buzzer is in discharge phase. Thus, output signal Vcomp of comparator 4 is in a high state to supply positive voltage pulses and in a low state to supply zero voltages.

With this principle of the invention, consisting in causing oscillation with positive feedback in the feedback loop, it is possible to increase the energy stored in capacitor Cb of the buzzer or audible alarm. An oscillation at the connection node between first coil L1 and capacitor Cb is forced close to the resonance frequency. It is therefore no longer necessary to provide a phase to calculate the resonance frequency of the buzzer, since the drive signals across capacitor Cb are capable of producing the resonant effect for each alarm or buzzer throughout the life cycle of the electronic device.

According to an embodiment described with reference to FIG. 1, the derivative circuit 3 may include an arrangement including a derivative capacitor C1, a resistor R1 and an amplifier 13, to produce a derivative of the signal across capacitor Cb. A first electrode of derivative capacitor C1 can be connected to the connection node between first coil L1 and capacitor Cb of the buzzer, and a second electrode is connected to a first input of amplifier 13. A second input of amplifier 13 is preferably connected to an earth terminal. A derivative resistor R1 is disposed between the first input of amplifier 13 and the output of amplifier 13, which supplies an output signal Vder. The first input of amplifier 13 is a negative input, whereas the second input of amplifier 13 is a positive input.

Derivative circuit 3 may also include means (not shown) for adjusting the level and amplitude of the oscillating signal produced by capacitor Cb. This oscillating signal is preferably a sinusoidal voltage, which may fluctuate between −10 V and +10 V. The derivative circuit signals must, in principle, be signals whose voltage is lower than supply voltage Vdd of electronic device 3. Supply voltage Vdd may be on the order of 1 V.

It is also to be noted that comparator 4 may be a hysteresis comparator. The hysteresis comparator can clearly define the two states of output signal Vcomp to be supplied to first coil L1 based on the comparison of derivative signal Vder with reference voltage Ref, which may be at Vdd/2 or at another voltage adjusted according to the application.

Electronic device 1 may also include a pre-charge circuit 9, which is connected to the connection node between the first coil or inductor L1 and capacitor Cb of the buzzer. When electronic device 1 is put into operation, this pre-charge circuit 9 charges capacitor Cb. Pre-charging initially capacitor Cb prevents derivative circuit 3 from supplying a zero derivative signal Vder and all the feedback loop components from remaining in a stable state prohibiting generation of a sound or music.

Electronic device 1 may also include a voltage limiter 8 connected to the connection node between the first coil or inductor L1 and capacitor Cb of the buzzer. Since the amplitude of the alternating voltage generated across capacitor Cb increases for generation of a sound by the membrane, voltage limiter 8 limits the oscillation to a defined voltage amplitude. The voltage limiter may be devised as two anti-parallel diodes mounted in parallel with capacitor Cb and having a defined cut-off voltage.

Electronic device 1 may also include a second coil or inductor L2 in assembly 2. This second coil L2 is connected to the second electrode of capacitor Cb of the buzzer by means of switch 7. The other end of second coil L2 is connected to a DSP logic unit 6. This DSP logic unit 6 may also be connected to the free end of first coil L1 by means of a multiplexer 10 controlled by a control unit 5.

DSP logic unit 6 and first and second coils L1 and L2 are arranged to generate music for example. Thus, a digital audio signal may be generated in DSP logic unit 6. The DSP logic unit must also include an FIR digital filter arranged in a sigma-delta circuit, which requires the two coils L1 and L2 for digital filtering of the signal to generate music or a melody in buzzer Cb.

Control unit 5 of electronic device 1 may be used to enable the various components of the device by means of a signal En, and to select the generation of an audible warning, such as an alarm, or of music or a melody. To generate an audible alarm or music, a selection signal Sel controls multiplexer 10 and switch 7. To generate an audible alarm in a first state of selection signal Sel, first coil L1 is connected to the output of comparator 4, and the second electrode of capacitor Cb is connected to earth. To generate a melody in a second state of selection signal Sel, the first coil is connected to DSP logic unit 6, and the second electrode of capacitor Cb is connected to the second coil L2, which is also connected to DSP logic unit 6.

As indicated above, pre-charge circuit 9 must charge capacitor Cb to actuate the feedback loop in order to generate the audible alarm with automatic amplification. Naturally, as soon as the feedback loop initialization phase is complete, pre-charge circuit 9 can be disconnected. It can also be provided that only those components necessary for generation of an audible alarm or for generation of music or a melody are actuated on the command of control unit 5. However, according to the invention and the configuration of electronic device 1 presented with reference to FIG. 1, an amplification or increase in the energy stored in capacitor Cb of the buzzer occurs only in the event of generation of an audible alarm. In this particular case, a high alarm volume can be obtained without using complementary DC-DC or charge pump circuits.

It is to be noted that the first and second coils L1 and L2, and capacitor Cb of the buzzer, are components that cannot easily be integrated with the other parts of electronic device 1 described above. By way of non-limiting example, the first and second inductors L1 and L2 may have an inductive value on the order of 100 µH and the capacitance of capacitor Cb may be on the order of 10 µF. This makes it possible to generate a resonance frequency of around 5 kHz in the audible range. In derivative circuit 3, resistor R1 may have a resistive value on the order of 10 MOhms, and the capacitance of derivative capacitor C1 may be on the order of 10 pF. These two components may thus be integrated with the other parts of electronic device 1.

Figure 2:
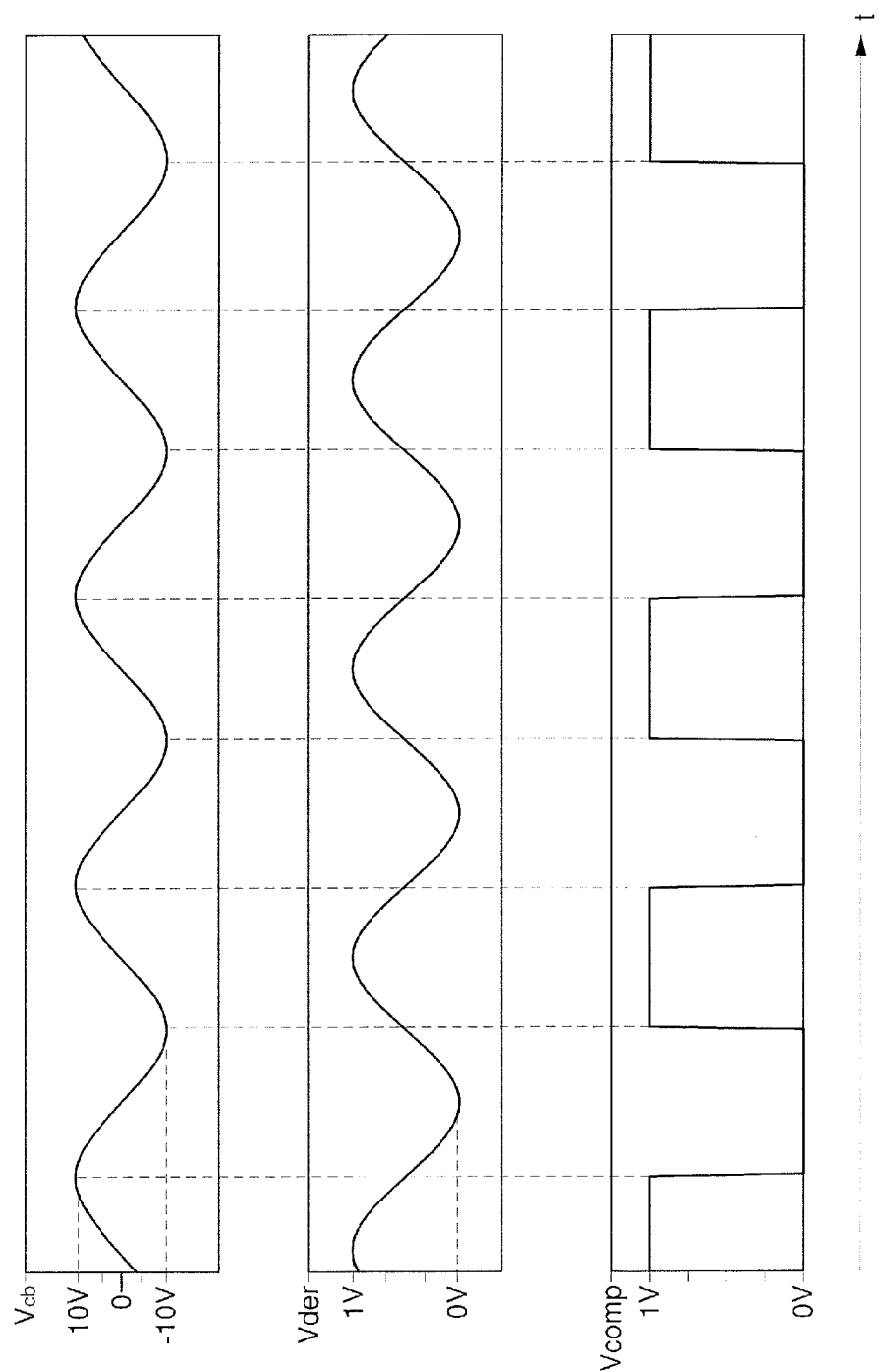
FIG. 2 shows various signals in the device for generation of an audible alarm or music according to the invention.

In the case of generation of an audible alarm, FIG. 2 shows various signals in the feedback loop. FIG. 2 shows firstly the oscillating signal across capacitor Cb, which is a sinusoidal voltage $V_{Cb}$. This oscillating signal across capacitor Cb is represented by its AC component. FIG. 2 also shows derivative signal Vder at the derivative circuit output, which is also a sinusoidal voltage Vder, but phase shifted by 90° from voltage $V_{Cb}$, and the comparator output signal, which is a pulsed voltage Vcomp for controlling the first inductor.

It is noted that, according to the invention, pulsed voltage Vcomp is a positive voltage when capacitor Cb is charged with a voltage $V_{Cb}$, which increases for the duration of pulsed voltage Vcomp. However, during the discharge of capacitor Cb, voltage $V_{Cb}$ decreases with a zero voltage Vcomp, which is desired. Thus an automatic increase in the voltage across capacitor Cb occurs as soon as the device for generation of an audible alarm is actuated with no need to adjust the resonance frequency.

According to the signals shown in FIG. 2, derivative signal Vder is compared to a reference voltage in the comparator, which is advantageously a voltage corresponding to half the supply voltage Vdd. This makes it possible to supply a positive voltage pulse at the output of comparator Vcomp throughout the charging of capacitor Cb of the buzzer. With a low positive voltage, it is nonetheless possible to amplify the sound generated by the buzzer owing to the feedback loop according to the invention.

Figure 3:
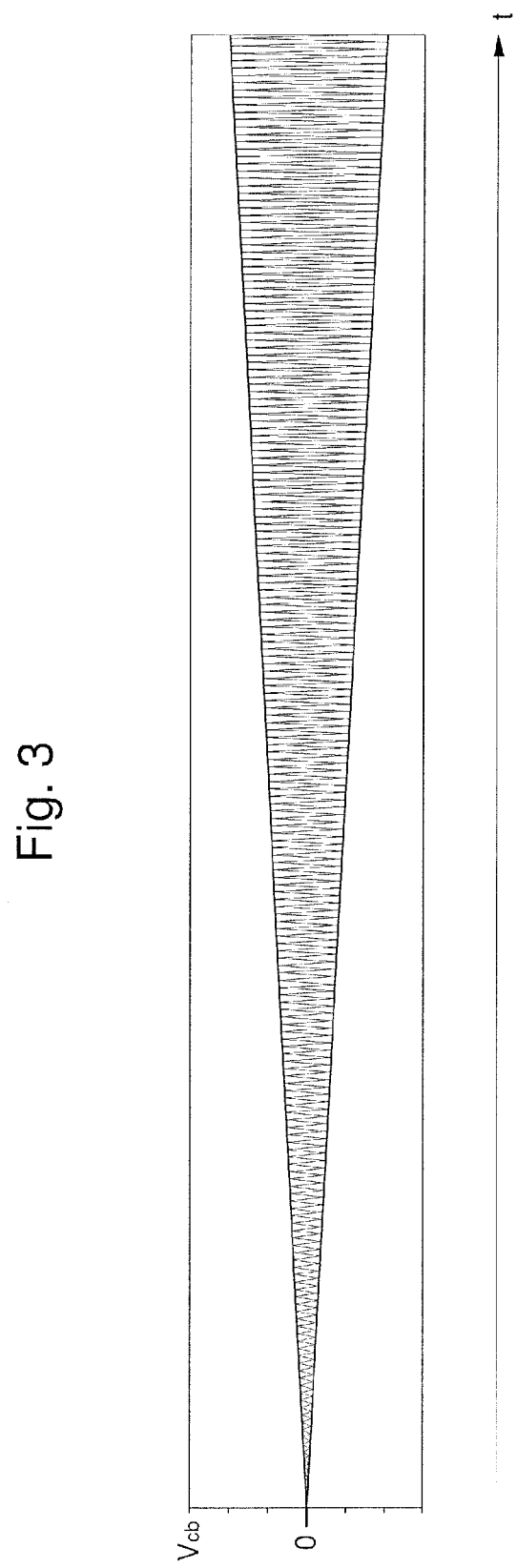
FIG. 3 shows the evolution of an output signal of the buzzer, modelled as a first approximation by a capacitor, during operation of the device according to the invention.

FIG. 3 shows simply the evolution of the signal across capacitor Cb illustrating the increase in sinusoidal voltage with time. The influence of the voltage limiter is not shown in FIG. 3. In an ideal situation, the amplitude of oscillation across capacitor Cb can increase up to several kVolts. However, in a normal case with an internal resistor in the first coil and the buzzer, the maximum amplitude of the voltage is around ten Volts, which makes it possible to integrate many of the components of the electronic device.

From the description that has just been given, several variant embodiments of the electronic device can be devised by those skilled in the art without departing from the scope of the invention defined by the claims. It is possible to envisage producing a similar feedback loop in the electronic device for generation of music. The voltage limit of the voltage limiter can be adjusted using the control unit. The electronic device may be disabled after a set time period following actuation.

What is claimed is:

1. An electronic device for generation of an audible alarm or music, the electronic device including at least one coil or inductor and a buzzer, which includes at least one capacitor connected in series with the coil, for generation of an audible alarm or music when the electronic device is actuated,
wherein the electronic device includes in a feedback loop,
a derivative circuit connected to a connection node between the coil and the capacitor of the buzzer, to produce a derivative of the signal from the capacitor, and a comparator for comparing the derivative signal of the derivative circuit with a reference voltage, the comparator supplying an output signal to the coil to amplify the signal across the capacitor, in order to generate at least one audible alarm.

2. The electronic device according to claim 1, wherein the comparator includes a first positive input for receiving the derivative signal and a second negative input for receiving the reference voltage, in order to supply an output signal in a high state, i.e. with a positive voltage, to the coil, when the capacitor is in a charge phase, and in a low state, i.e. with a zero voltage, to the coil, when the capacitor is in a discharge phase.

3. The electronic device according to claim 2, wherein the second negative input of the comparator receives a reference voltage, which is defined as a voltage equal to half the supply voltage, in order to supply an output signal in a high state to the coil throughout the entire charge phase of the capacitor.

4. The electronic device according to claim 2, wherein the comparator is a hysteresis comparator.

5. The electronic device according to claim 1, wherein the derivative circuit includes a derivative capacitor connected, on the one hand, to the connection node between the coil and the capacitor of the buzzer, and on the other hand, to a first negative input of an amplifier, a second positive input of the amplifier being connected to a zero voltage or to an earth terminal, and a resistor connected between the first negative input and an output of the amplifier, which supplies the derivative signal.

6. The electronic device according to claim 1, wherein the electronic device includes a pre-charge circuit, which is connected to the connection node between the coil and the capacitor in order to pre-charge the capacitor when the electronic device is actuated.

7. The electronic device according to claim 1, wherein the electronic device includes a voltage limiter circuit, which is connected to the connection node between the coil and the capacitor to limit the amplitude of the oscillating signal across the capacitor.

8. The electronic device according to claim 1, wherein the capacitor includes a first electrode connected to the coil and a second electrode connected by means of a switch to a zero voltage or to an earth terminal.

9. The electronic device according to claim 8, wherein the electronic device includes another or a second coil or inductor connected to the second electrode of the capacitor by means of the switch, this switch being controlled by a control unit to connect the second electrode of the capacitor to the earth terminal or to the second coil.

10. The electronic device according to claim 9, wherein the other end of the second coil is connected to a logic unit which is also connected to the coil or first coil by means of a multiplexer controlled by the control unit, the output signal of the comparator being supplied to the first coil also by means of the multiplexer, said multiplexer being controlled by a selection signal of the control unit, in a first state of the selection signal, the first coil being connected to the output of the comparator, and the second electrode of the capacitor being connected to the earth terminal, and in a second state of the selection signal, the first coil being connected to the logic unit, and the second electrode of the capacitor being connected to the second coil.

* * * * *